United States Patent
Werner

(10) Patent No.: US 9,786,659 B2
(45) Date of Patent: Oct. 10, 2017

(54) SEMICONDUCTOR COMPONENT WITH DIELECTRIC LAYER STACK AND VOLTAGE DIVIDER

(75) Inventor: Wolfgang Werner, Munich (DE)

(73) Assignee: Infineon Technologies Austria AG, Villach (AT)

(*) Notice: Subject to any disclaimer, the term of this patent is extended or adjusted under 35 U.S.C. 154(b) by 861 days.

(21) Appl. No.: 12/862,821

(22) Filed: Aug. 25, 2010

(65) Prior Publication Data

US 2011/0049667 A1 Mar. 3, 2011

(30) Foreign Application Priority Data

Aug. 25, 2009 (DE) .............. 102009038709

(51) Int. Cl.
*H01L 27/088* (2006.01)
*H01L 23/52* (2006.01)
*H01L 27/08* (2006.01)
*H01L 27/06* (2006.01)

(52) U.S. Cl.
CPC .......... *H01L 27/0802* (2013.01); *H01L 23/52* (2013.01); *H01L 27/0676* (2013.01); *H01L 27/0805* (2013.01); *H01L 27/0814* (2013.01)

(58) Field of Classification Search
CPC .............................. H01L 27/0805; H01L 23/52
USPC ....... 257/314–317, 319–323, E29.3–E29.309
See application file for complete search history.

(56) References Cited

U.S. PATENT DOCUMENTS

| | | | |
|---|---|---|---|
| 4,638,346 A | 1/1987 | Inami et al. | |
| 6,069,381 A | 5/2000 | Black et al. | |
| 6,358,785 B1 | 3/2002 | Chittipeddi et al. | |
| 6,677,641 B2 | 1/2004 | Kocon | |
| 6,717,230 B2 | 4/2004 | Kocon | |
| 6,750,066 B1* | 6/2004 | Cheung et al. | 438/3 |
| 7,294,877 B2* | 11/2007 | Rueckes et al. | 257/296 |
| 7,414,286 B2 | 8/2008 | Hirler et al. | |
| 2004/0084721 A1 | 5/2004 | Kocon et al. | |
| 2007/0138544 A1 | 6/2007 | Hirler et al. | |
| 2009/0114986 A1 | 5/2009 | Hirler et al. | |
| 2009/0185426 A1 | 7/2009 | Wang et al. | |

(Continued)

FOREIGN PATENT DOCUMENTS

| | | |
|---|---|---|
| CN | 1211827 A | 3/1999 |
| CN | 1330406 A | 1/2002 |
| CN | 1346138 A | 4/2002 |

(Continued)

*Primary Examiner* — Marcos D Pizarro

(74) *Attorney, Agent, or Firm* — Murphy, Bilak & Homiller, PLLC

(57) ABSTRACT

A semiconductor component has a semiconductor body zone, a first electrically conductive layer adjacent to the semiconductor body zone, a first dielectric layer with first dielectric properties and a second dielectric layer with second dielectric properties. The first dielectric properties differ from the second dielectric properties. The first dielectric layer and the second dielectric layer are arranged between the semiconductor body zone and the first electrically conductive layer. A second electrically conductive layer is applied between the first dielectric layer and the second dielectric layer. A first voltage divider is switched between the first electrically conductive layer and the semiconductor body zone. The second electrically conductive layer is electrically conductively connected only to the voltage divider.

20 Claims, 3 Drawing Sheets

(56) References Cited

U.S. PATENT DOCUMENTS

2009/0206401 A1    8/2009   Hirler et al.

FOREIGN PATENT DOCUMENTS

| CN | 1364316 A | 8/2002 |
| DE | 10297349 T5 | 1/2005 |
| DE | 10361697 A1 | 8/2005 |
| DE | 102005041256 B4 | 3/2007 |
| DE | 102005041358 A1 | 3/2007 |

* cited by examiner

SEMICONDUCTOR COMPONENT WITH DIELECTRIC LAYER STACK AND VOLTAGE DIVIDER

PRIORITY CLAIM

This application claims priority from German Patent Application No. 10 2009 038 709.9 filed on 25 Aug. 2009, said German Patent Application incorporated herein by reference in its entirety.

BACKGROUND

Semiconductor elements that have a dielectric layer stack between one semiconductor body and an electrically conductive layer located above it, have the problem that the interface between the dielectric layers can become charged. This can go so far that undesirable inversion or accumulation layers form in the semiconductor body even in the switched-off state, which can cause increased leakage currents, short circuits or a reduction in the flashover voltage.

SUMMARY

According to the embodiments described herein, a semiconductor component is provided which has a dielectric layer stack that does not have any interfacial charges at the interface between the dielectric layers.

One embodiment of the semiconductor component has a semiconductor body zone. A first electrically conductive layer is arranged above the semiconductor body zone. Between the semiconductor body zone and the first electrically conductive layer a first dielectric layer with first dielectric properties and a second dielectric layer with second dielectric properties are arranged, wherein the first dielectric properties differ from the second dielectric properties. A second electrically conductive layer is arranged between the first dielectric layer and the second dielectric layer. The semiconductor component furthermore has a voltage divider, which is switched between the first conductive layer and the semiconductor body zone. The second electrically conductive layer is electrically conductively connected only to this voltage divider.

The second electrically conductive layer between the different dielectrics prevents charges from collecting at the interface between the dielectrics. The charges penetrating through these dielectrics are dissipated via the second electrically conductive layer and the voltage divider. Thus no charges can collect in the dielectric zone between the semiconductor body zone and the first electrically conductive layer. The second electrically conductive layer always remains at the same potential.

It is a further development that the first dielectric layer has a thickness of 100 nm to 2 μm.

Another embodiment provides that the first dielectric layer adjoins the semiconductor body zone.

The second dielectric layer has a thickness of 100 nm to 2 μm in one embodiment.

It is a further development that the second dielectric layer adjoins the first electrically conductive layer.

One exemplary embodiment has different electric conductivities of the first and the second dielectric layer.

A further exemplary embodiment provides that the first dielectric layer is composed of $SiO_2$ and the second dielectric layer is composed of a dielectric material different from $SiO_2$.

It is a further development that at least one of the dielectric layers has a negative temperature coefficient of the relative dielectric constants.

Furthermore, the voltage divider can be composed of at least one electrical resistance and at least one diode. At least one electrical resistance can thereby be switched between the first electrically conductive layer and the second electrically conductive layer and at least one diode can be switched between the second electrically conductive layer and the semiconductor body zone.

Alternatively, the voltage divider can be composed of at least two electrical resistances. To this end, at least one electrical resistance can be switched between the first electrically conductive layer and the second conductive layer and at least one other electrical resistance can be switched between the second electrically conductive layer and the semiconductor body zone. Moreover, at least one electrical resistance can be switched between the first electrically conductive layer and the second electrically conductive layer and at least one other electrically conductive resistance can be switched between the second electrically conductive layer and a third conductive layer, wherein the third conductive layer is electrically connected to the semiconductor body zone.

Another embodiment provides that at least one electrical resistance is part of the first dielectric layer or the second dielectric layer.

In yet another embodiment, the voltage divider is embodied from at least two diodes. At least one diode can thereby be switched between the first electrically conductive layer and the second electrically conductive layer and at least one other diode can be switched between the second electrically conductive layer and the semiconductor body zone.

The semiconductor body zone is a channel zone of a MOS transistor according to another embodiment.

Advantageously, the second electrically conductive layer has a thickness of 10 nm to 100 nm.

Those skilled in the art will recognize additional features and advantages upon reading the following detailed description, and upon viewing the accompanying drawings.

BRIEF DESCRIPTION OF THE FIGURES

The components in the figures are not necessarily to scale, instead emphasis being placed upon illustrating the principles of the invention. Moreover, in the figures, like reference numerals designate corresponding parts. In the drawings.

DETAILED DESCRIPTION

Exemplary embodiments of the invention are explained in more detail below with reference to the attached figures.

However, the invention is not limited to the concretely described embodiments, but can be modified and changed in a suitable manner. It is within the scope of the invention to combine individual features and feature combinations of one embodiment with features and feature combinations of another embodiment in a suitable manner in order to achieve further embodiments according to the invention.

Figure 1:
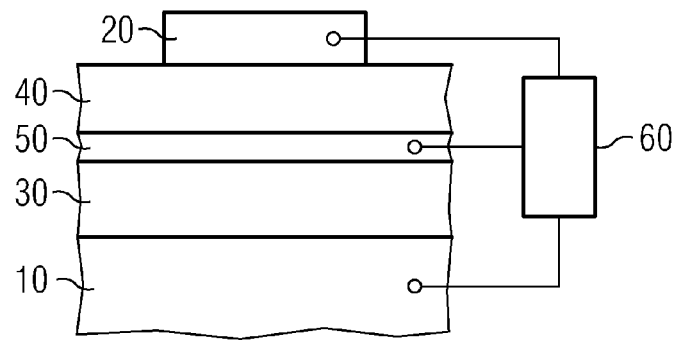
FIG. 1 shows a diagrammatic structure of an embodiment of a semiconductor component with an electrically conductive layer between two dielectric layers, which is connected to a voltage divider.

FIG. 1 shows in a diagrammatic manner part of a cross section of a semiconductor component. The semiconductor component has a semiconductor body zone 10, which is part of a semiconductor body. The semiconductor body zone 10 can be, for example, a doped region in a semiconductor substrate. In particular, the semiconductor body zone 10 can be a channel zone in an MOS field-effect transistor or in an IGBT.

A first electrically conductive layer 20 is arranged adjacent to the semiconductor body zone 10. The first electrically conductive layer 20 can be, for example, a channel control electrode (gate electrode) of an MOS semiconductor field-effect transistor or of an IGBT. In another example, the electrically conductive layer 20, however, can also be a conductive line for guiding a current. Usually this first electrically conductive layer 20 is located in the case of operation of the semiconductor component at a potential increased to the semiconductor body 10. In the event that the first electrically conductive layer 20 is used as a channel control electrode, a channel can thus be embodied in the semiconductor body zone 10 (channel zone) between two other doped regions in the semiconductor body.

Between the semiconductor body zone 10 and the first electrically conductive layer 20 a first dielectric layer 30 with first dielectric properties and a second dielectric layer 40 with second dielectric properties are located. The first dielectric properties thereby differ from the second dielectric properties. For example, the first dielectric layer 30 can have an electrical conductivity that is different from the second dielectric layer 40.

The first dielectric layer 30, for example, can have a thickness of 100 nm to 2 µm. In the exemplary embodiment shown the first dielectric layer 30 borders the semiconductor body zone 10. For example, the first dielectric layer is composed of $SiO_2$.

The second dielectric layer 40, for example, has a thickness of 100 nm to 2 µm. In the exemplary embodiment shown, the second dielectric layer 40 adjoins the first electrically conductive layer 20. In the event that the first dielectric layer 30 is composed of $SiO_2$, the second dielectric layer 40 is preferably made of a dielectric material different from $SiO_2$. This provides advantages, for example, for defect density reduction and thus for the improvement of the reliability of the semiconductor component.

Another embodiment can be that the first dielectric layer 30 is a thermally grown $SiO_2$ and the second dielectric layer 40 is an oxide layer or oxide nitride layer precipitated from the gas phase. In a further embodiment at least one of the dielectric layers 30 or 40 can have a negative temperature coefficient of the relative dielectric constants. This at least one dielectric layer can thereby be composed of a paraelectric material, such as, for example, of a substance from the group $Ba_xSr_{1-x}TiO_3$ and/or $KTaO_3$. Or the at least one dielectric layer thereby has a ferroelectric substance with, for example, a Curie temperature $T_C$<220 K, wherein: $\in_r \sim C/(T-T_C)$.

Figure 2:
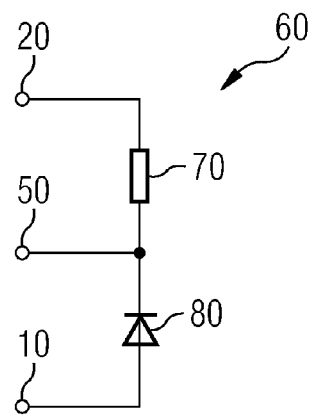
FIG. 2 shows an equivalent circuit for an embodiment of a voltage divider.

FIG. 2 shows in a diagrammatic equivalent circuit an exemplary embodiment of a voltage divider 60 of this type. The voltage divider 60 is thereby composed of at least one electrical resistance 70 and at least one diode 80. At least one electrical resistance 70 is thereby switched, for example, between the first electrically conductive layer 20 and a second electrically conductive layer 50. At least one diode is furthermore switched between the second electrically conductive layer 50 and the semiconductor body zone 10.

Figure 3:
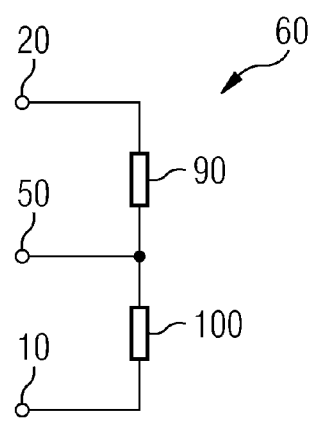
FIG. 3 shows an equivalent circuit for an alternative embodiment of a voltage divider.

An alternative embodiment of a voltage divider 60 is shown in FIG. 3 in a diagrammatic equivalent circuit. In this example the voltage divider 60 is composed of at least two electrical resistances 90 and 100, wherein at least one electrical resistance 90 is switched between the first electrically conductive layer 20 and the second electrically conductive layer 50 and at least one other electrical resistance 100 is switched between the second electrically conductive layer 50 and the semiconductor body zone 10.

Figure 4:
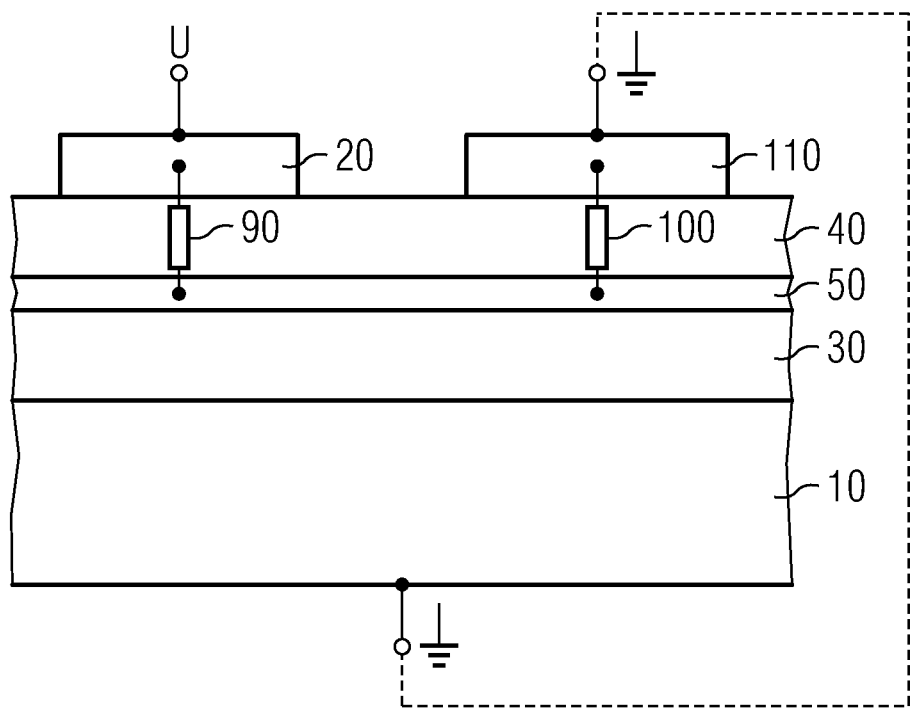
FIG. 4 shows a diagrammatic cross-sectional view of an embodiment of a semiconductor component with an electrically conductive layer between two dielectric layers and an integrated voltage divider.

FIG. 4 shows an example of how a voltage divider can be integrated into a semiconductor component. The structure of the semiconductor component in this example for the most part corresponds to the structure of the semiconductor component as described for FIG. 1. In contrast to FIG. 1, in this exemplary embodiment of FIG. 3, however, a third conductive layer 110 is present adjacent to the second dielectric layer 40. The third conductive layer 110 is thereby separated by the second dielectric layer 40 from the second conductive layer 50. The third electrically conductive layer 110 in this exemplary embodiment is electrically connected to the semiconductor body zone 10 or lies at least at the same electrical potential as the semiconductor body zone 10. This is indicated in FIG. 4 by the broken line and is clarified by the common ground symbol.

The voltage divider 60 in this embodiment is realized by two electrical resistances 90 and 100, wherein the two electrical resistances are formed by the ohmic resistances of the second dielectric layer 40. The first electrical resistance 90 is thereby formed by the path in the second dielectric layer 40 between the first conductive layer 20 and the second conductive layer 50. The second electrical resistance is formed by the path in the second dielectric layer 40 between the second electrically conductive layer 50 and the third electrically conductive layer 110. The division ratio of the voltage can thereby be adjusted by the area ratios of the respective areas under the first or third conductive layer.

Figure 5:
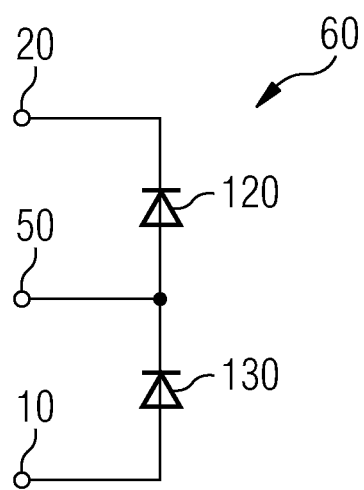
FIG. 5 shows an equivalent circuit for an alternative embodiment of a voltage divider.
Figure 6:
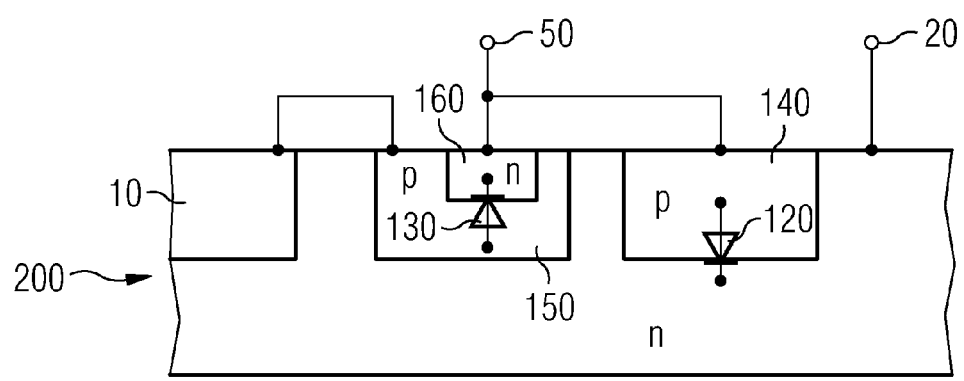
FIG. 6 shows in a diagrammatic cross-sectional view an embodiment of a voltage divider integrated into a semiconductor body.

Another embodiment of a voltage divider 60 is shown in FIG. 5 in a diagrammatic equivalent circuit. In this embodiment the voltage divider 60 is formed from at least two diodes 120 and 130. At least one diode 120 is switched between the first electrically conductive layer 20 and the second conductive layer 50 and at least one other diode 130 are switched between the second conductive layer 50 and the semiconductor body zone 10. An exemplary embodiment for the integrated realization of a voltage divider 60 of this type with at least two diodes is shown diagrammatically in FIG. 6. In a semiconductor body 200, for example, an n-doped semiconductor body 200, a doped well 140, for example, a p-doped well is embodied, which with the semiconductor body 200 forms the first diode 120. A further exemplary p-doped well 150 in the semiconductor body 200 forms together with an n-doped well 160 produced in this further p-doped well 150 the second diode 130. The semiconductor body 200 in this exemplary embodiment is electrically connected to the first electrically conductive layer 20. The further p-doped well 150 is electrically connected to the semiconductor body zone 10 and the n-doped well 160 is electrically connected to the p-doped well 140 and to the second electrically conductive layer 50.

The first diode 120 is thus switched between the first conductive layer 20 and the second conductive layer 50 and the second diode 130 is switched between the second conductive layer 50 and the semiconductor body zone 10. The semiconductor body zone 10 can thereby also be embodied in the semiconductor body 200. The electrical connection between the individual semiconductor wells can be carried out via metallization planes.

In the event of a voltage of 0 volts applied to the first conductive layer 20, the first diode 120 in this example has the function of discharging the second electrically conductive layer 50. While the second diode 130 has the function of forming a voltage divider with the first diode 120.

All of the exemplary embodiments shown can be realized in planar technology on a semiconductor body or in a trench in a semiconductor body.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor component, comprising:
a semiconductor body;
a first electrically conductive layer on the semiconductor body;
a first dielectric layer between the semiconductor body and the first electrically conductive layer and having first dielectric properties;
a second dielectric layer between the semiconductor body and the first electrically conductive layer and having second dielectric properties different from the first dielectric properties; and
a second electrically conductive layer between the first dielectric layer and the second dielectric layer;
wherein the second electrically conductive layer dissipates charges penetrating through the first and second dielectric layers via an electrically conductive connection that is fixed regardless of the operating state of the semiconductor component.

2. A semiconductor component, comprising:
a semiconductor body;
a first electrically conductive layer on the semiconductor body;
a first dielectric layer between the semiconductor body and the first electrically conductive layer and having first dielectric properties;
a second dielectric layer between the semiconductor body and the first electrically conductive layer and having second dielectric properties different from the first dielectric properties;
a second electrically conductive layer between the first dielectric layer and the second dielectric layer; and
a voltage divider having a first node connected to the semiconductor body, a second node connected to the first electrically conductive layer and a third node connected to the second electrically conductive layer, wherein the third node of the voltage divider is always connected to the second electrically conductive layer regardless of the operating state of the semiconductor component.

3. A semiconductor component, comprising:
a semiconductor body;
a first electrically conductive layer adjacent the semiconductor body;
a first dielectric layer located between the semiconductor body and the first electrically conductive layer and having first dielectric properties;
a second dielectric layer located between the semiconductor body and the first electrically conductive layer and having second dielectric properties different from the first dielectric properties;
a second electrically conductive layer arranged between the first dielectric layer and the second dielectric layer; and
a voltage divider, connected to the semiconductor body, the first electrically conductive layer and the second electrically conductive layer, wherein the second electrically conductive layer is connected to the voltage divider by an electrically conductive connection that is constant in all operating states of the semiconductor component.

4. The semiconductor component according to claim 3, wherein the first dielectric layer has a thickness of 10 nm to 2 μm.

5. The semiconductor component according to claim 3, wherein the first dielectric layer adjoins the semiconductor body.

6. The semiconductor component according to claim 3, wherein the second dielectric layer has a thickness of 10 nm to 2 μm.

7. The semiconductor component according to claim 3, wherein the second dielectric layer adjoins the first electrically conductive layer.

8. The semiconductor component according to claim 3, wherein the first and second dielectric layers have different electrical conductivities.

9. The semiconductor component according to claim 3, wherein the first dielectric layer is composed of $SiO_2$ and the second dielectric layer is composed of a dielectric material different from $SiO_2$.

10. The semiconductor component according to claim 3, wherein at least one of the dielectric layers has a negative temperature coefficient of the relative dielectric constants $\in_r$.

11. The semiconductor component according to claim 3, wherein the semiconductor body is a channel of an MOS transistor.

12. The semiconductor component according to claim 3, wherein the second electrically conductive layer has a thickness of 10 nm to 100 nm.

13. The semiconductor component according to claim 3, wherein the voltage divider is composed of at least one electrical resistance and at least one diode.

14. The semiconductor component according to claim 13, wherein the at least one electrical resistance is switched between the first electrically conductive layer and the second electrically conductive layer and the at least one diode is switched between the second electrically conductive layer and the semiconductor body zone.

15. The semiconductor component according to claim 3, wherein the voltage divider is composed of at least two diodes.

16. The semiconductor component according to claim 15, wherein a first one of the at least two diodes is switched between the first electrically conductive layer and the second electrically conductive layer and a second one of the at least two diodes is switched between the second electrically conductive layer and the semiconductor body zone.

17. The semiconductor component according to claim 3, wherein the voltage divider comprises at least two electrical resistances.

18. The semiconductor component according to claim 17, wherein a first one of the at least two electrical resistances is connected to the first electrically conductive layer and the second conductive layer and a second one of the at least two electrical resistances is connected to the second electrically conductive layer and the semiconductor body.

19. The semiconductor component according to claim 17, wherein a first one of the at least two electrical resistances is switched between the first electrically conductive layer and the second electrically conductive layer and a second one of the at least two electrical resistances is switched between the second electrically conductive layer and a third electrically conductive layer, wherein the third conductive layer is electrically connected to the semiconductor body zone.

20. The semiconductor component according to claim 17, wherein at least one of the at least two electrical resistances is part of the first dielectric layer or the second dielectric layer.

* * * * *